(12) United States Patent
Maniktala et al.

(10) Patent No.: US 8,779,786 B2
(45) Date of Patent: Jul. 15, 2014

(54) REMOTE SENSING OF PD-SIDE VOLTAGE IN 4-PAIR POE APPLICATIONS FOR ESTIMATING CABLE RESISTANCE

(75) Inventors: Sanjaya Maniktala, Fremont, CA (US); Sesha Panguluri, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 246 days.

(21) Appl. No.: 13/276,263

(22) Filed: Oct. 18, 2011

(65) Prior Publication Data

US 2013/0093444 A1 Apr. 18, 2013

(51) Int. Cl.
*G01R 27/08* (2006.01)
*G01R 27/16* (2006.01)
*G06F 1/26* (2006.01)
*H04L 12/10* (2006.01)

(52) U.S. Cl.
CPC ............... *G01R 27/16* (2013.01); *H04L 12/10* (2013.01); *G06F 1/266* (2013.01)
USPC ............ 324/713; 324/725; 324/526; 700/286

(58) Field of Classification Search
CPC .......... G01R 27/16; H04L 12/10; G06F 1/266
USPC .......................... 324/713, 725, 526, 610, 648
See application file for complete search history.

(56) References Cited

U.S. PATENT DOCUMENTS

| | | | | |
|---|---|---|---|---|
| 7,500,118 B2* | 3/2009 | Crawley et al. | ............... | 713/300 |
| 7,511,515 B2* | 3/2009 | Herbold | ........................ | 324/691 |
| 2006/0178783 A1* | 8/2006 | Herbold et al. | ............... | 700/286 |
| 2007/0170903 A1* | 7/2007 | Apfel | ............................ | 323/282 |
| 2008/0164890 A1* | 7/2008 | Admon et al. | ................. | 324/713 |
| 2009/0033345 A1* | 2/2009 | Picard et al. | .................. | 324/705 |
| 2011/0161693 A1* | 6/2011 | Schindler | ...................... | 713/300 |
| 2013/0076146 A1* | 3/2013 | Maniktala | ...................... | 307/80 |

* cited by examiner

*Primary Examiner* — Huy Q Phan
*Assistant Examiner* — Dustin Dickinson
(74) *Attorney, Agent, or Firm* — Oblon, Spivak, McClelland, Maier & Neustadt, L.L.P.

(57) ABSTRACT

Provided is a system and associated method for detecting a resistance of a cable. An example method may comprise applying power to a first end of a first and a second conductive pair of the cable, measuring a first voltage across the first end of the first and second conductive pairs of the cable, applying a current source across the first end of a third and a fourth conductive pair of the cable, measuring a second voltage across the current source, and determining a resistance of the cable using the measured first and second voltages. This method may be carried out in a physical arrangement where a second end of the first, second, third and fourth conductive pairs of the cable are connected to a first, a second, a third and a fourth input terminal of a powered device, respectively.

8 Claims, 4 Drawing Sheets

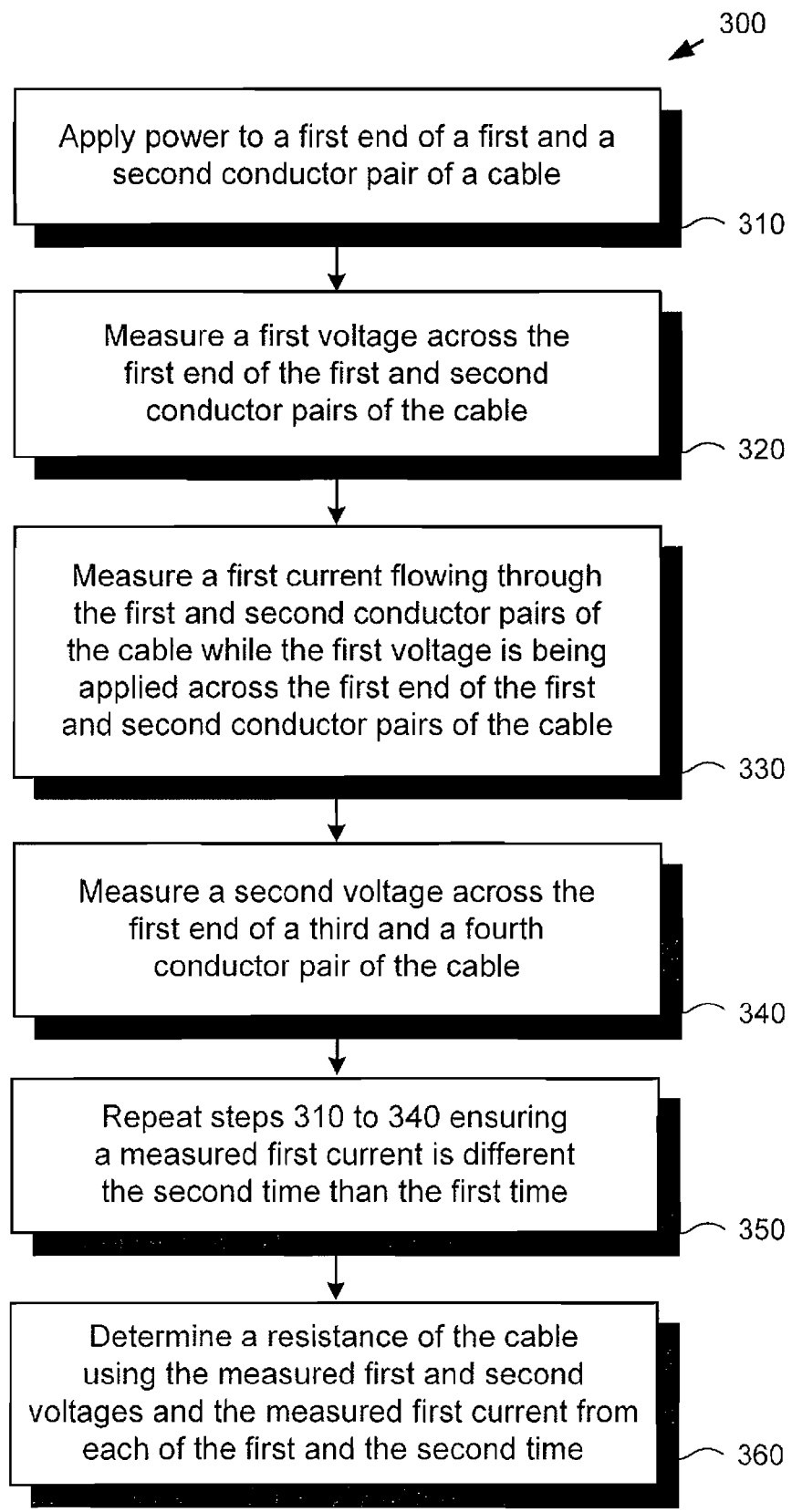

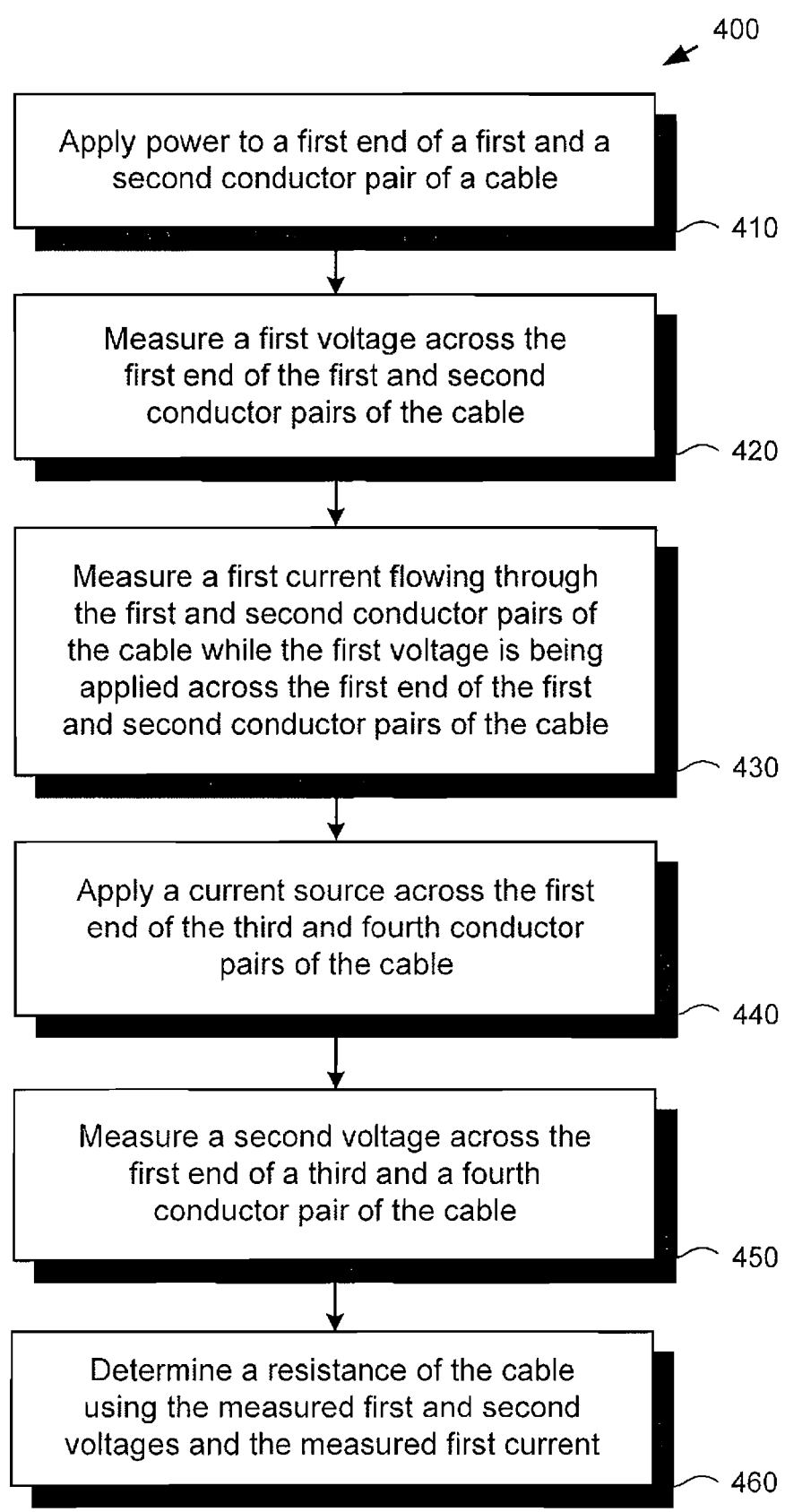

REMOTE SENSING OF PD-SIDE VOLTAGE IN 4-PAIR POE APPLICATIONS FOR ESTIMATING CABLE RESISTANCE

BACKGROUND OF THE INVENTION

1. Field of the Invention

The present invention relates generally to detection protocols. More particularly, the present invention relates to protocols for remote sensing of a PD-side voltage in 4-pair PoE applications for estimating cable resistance.

2. Background Art

Power over Ethernet (also known as PoE) technology allows electronic devices such as IP telephones, wireless LAN Access Points, Security network cameras and other IP-based terminals to receive power, in parallel to data, over an existing Ethernet infrastructure without the need to make modifications to the infrastructure. However, implementation of PoE solutions involves numerous challenges. Specifically, as PoE technology continues to advance and proliferate, there is an increasing need to ensure efficiency in the allocation and distribution of power to these devices.

In a conventional PoE arrangement a power sourcing equipment device (PSE) is connected to a powered device (PD) via an Ethernet cable. The Ethernet cable serves as the data/power interface between Ethernet elements, for example between a PSE and a PD. It is the responsibility of the PSE to allocate and distribute power to one or more connected PDs. Because a certain amount of power is lost due to such factors as cable resistance, such losses must be budgeted for when determining relative allocation of power by a PSE.

However, to avoid overtaxing a PSE supply, conventional PoE design has typically budgeted for cable losses by allocating a standard-wide, maximum power loss based on an assumed maximum cable length at an assumed cable resistance per meter. Thus, actual losses on a particular cable are not actually estimated by a conventional PSE. Consequently and especially in high power applications, conventional PoE power allocation and delivery protocols under-utilize the power distribution capacity of a PSE where assumed cable losses are budgeted for at inaccurately high levels.

Accordingly, there is a need to overcome the drawbacks and deficiencies in the art by providing a physical design and associated detection protocol that is relatively inexpensive and simple to implement while allowing an accurate estimation of the actual cable resistance, and hence, actual cable loss in a particular PoE application.

SUMMARY OF THE INVENTION

The present application is directed to a system and associated method employing protocols for remote sensing of a PD-side voltage in power over Ethernet applications for estimating cable resistance, substantially as shown in and/or described in connection with at least one of the figures, as set forth more completely in the claims.

BRIEF DESCRIPTION OF THE DRAWINGS

The features and advantages of the present invention will become more readily apparent to those ordinarily skilled in the art after reviewing the following detailed description and accompanying drawings, wherein:

FIG. 3 presents a flowchart illustrating a method implementing detection protocols for remote sensing of a PD-side voltage in PoE applications for estimating cable resistance, according to one embodiment of the present invention.

FIG. 4 presents a flowchart illustrating a method implementing detection protocols for remote sensing of a PD-side voltage in PoE applications for estimating cable resistance, according to another embodiment of the present invention.

DETAILED DESCRIPTION OF THE INVENTION

Figure 1:
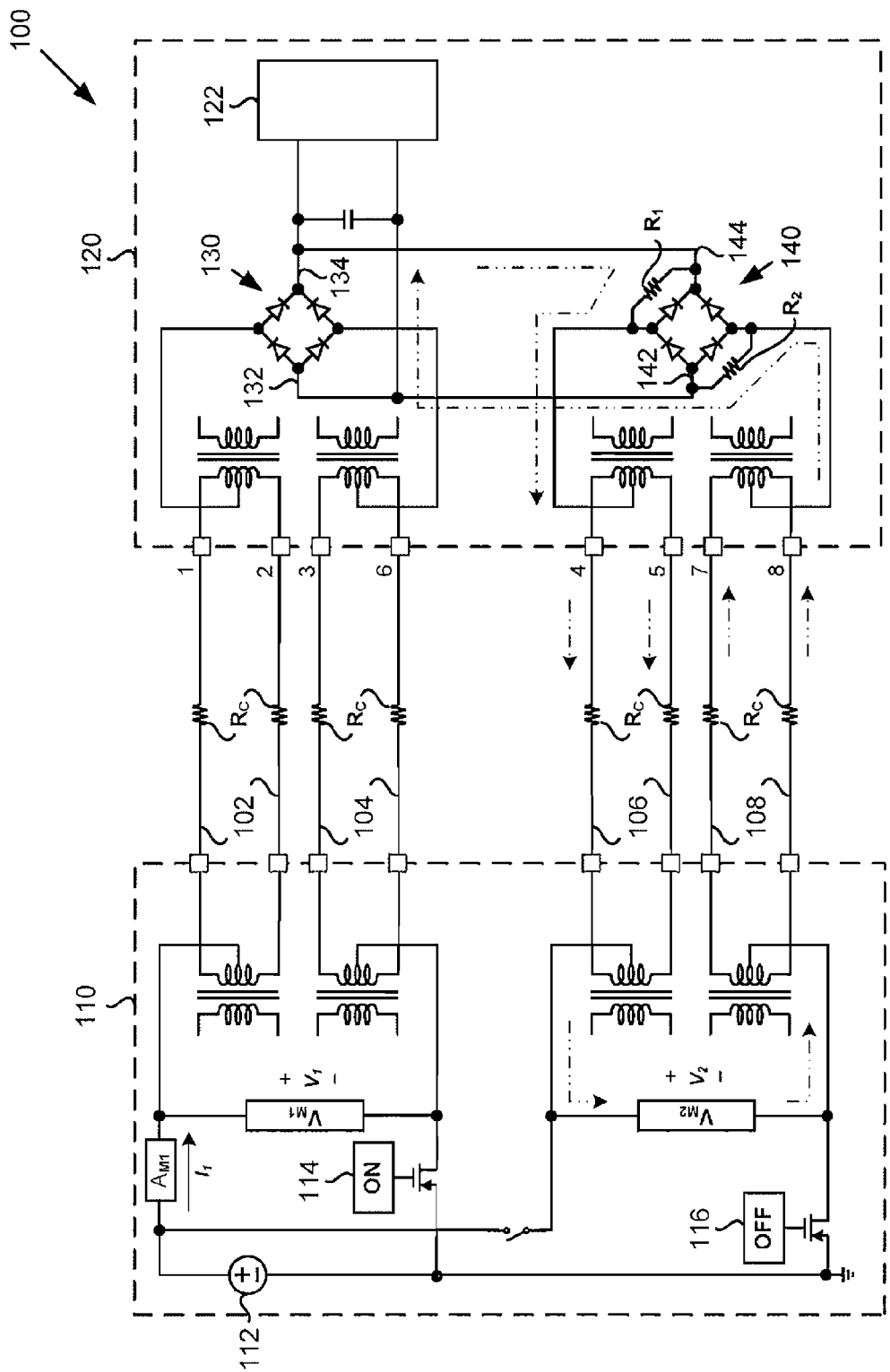
FIG. 1 presents a diagram of a system implementing a protocol for remote sensing of a PD-side voltage in PoE applications for estimating cable resistance, according to one embodiment of the present invention.

The present application is directed to a system implementing one or more protocols for remote sensing of a PD-side voltage in PoE applications for estimating cable resistance. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention, which use the principles of the present invention, are not specifically described in the present application and are not specifically illustrated by the present drawings. Unless noted otherwise, like or corresponding elements among the figures may be indicated by like or corresponding reference numerals. Moreover, the drawings and illustrations in the present application are generally not to scale, and are not intended to correspond to actual relative dimensions.

A first embodiment of the present invention will now be discussed with reference to FIG. 1. FIG. 1 discloses a system 100 implementing a protocol for remote sensing of a PD-side voltage in PoE applications for estimating cable resistance, according to a first embodiment of the present invention. As shown in FIG. 1, system 100 includes novel power sourcing equipment device (PSE) 110 and novel powered device (PD) 120 connected to one another by way of, for example, an Ethernet cable connection, or an input cable, which includes first and second data pairs 102 and 104, respectively, and first and second spare pairs 106 and 108, respectively. Each conductive line of a pair within the Ethernet cable may have an intrinsic resistance $R_C$. In operation, PSE 110 may be configured to utilize first and second data pairs 102 and 104, respectively, and/or first and second spare pairs 106 and 108, respectively, to power PD 120 which may be, by way of example, an IP telephone, wireless LAN Access Point, Security network camera or other IP-based terminal. For the purposes of the present application, a powered device may be considered to encompass a device which receives power from another device, for example from a PSE, but may also include a self-powered device, or a device which is currently unpowered but may be configured to receive power from another device, such as a PSE, for example.

PSE 110 embodies a design which allows it to carry out a protocol for remote sensing of a PD-side voltage to estimate cable resistance while connected to either a conventional PD, or a PD of the present invention, for example PD 120. Likewise, novel PD 120 may be compatible with conventional, IEEE-compliant PSEs, but also includes design features which allow it to facilitate a PSE of the present invention, for example PSE 110, to estimate actual cable resistance, and hence, losses according to an embodiment of the present invention.

According to FIG. 1, novel PSE 110 may include a power supply 112, which may supply PSE 110 with, for example, 48V. The positive terminal of power supply 112 may be connected to a first output terminal of PSE 110 through a current sensing circuit $A_{M1}$ and the negative terminal may be connected to a second output terminal of PSE 110 through a switch 114. Likewise, the positive terminal of power supply 112 may further be connected to a third output terminal of PSE 110 and the negative terminal of power supply 112 may further be connected to a fourth output terminal of PSE 110 through a switch 116. First and second output terminals may correspond to connection points for a first and a second data pair 102 and 104, respectively, of an Ethernet cable, for example. Likewise third and fourth output terminals may correspond to connection points for a first and a second spare pair 106 and 108, respectively, of an Ethernet cable, for example. Novel PSE 110 may further include a first voltage sensing circuit $V_{M1}$ connected across the first and second output terminals of PSE 110 as well as a second voltage sensing circuit $V_{M2}$ connected across the third and fourth output terminals of PSE 110. First and second voltage sensing circuits $V_{M1}$ and $V_{M2}$, respectively, may be configured to measure voltages $V_1$ and $V_2$, repsectively.

According to FIG. 1, novel PD 120 may include a first bridge rectifier 130 and second bridge rectifier 140 each having first and second input terminals, a rectified positive rail and a rectified negative rail. Thus, FIG. 1 shows rectified positive rail 134 and rectified negative rail 132 of first bridge rectifier 130 and rectified positive rail 144 and negative rectified rail 142 of second bridge rectifier 140. As can be seen, Ethernet inputs may be connected to novel PD 120 such that first data pair 102, comprising conductors 1,2, is connected to a first input terminal of first bridge rectifier 130 and second data pair 104, comprising conductors 3,6, is connected to the second input terminal of first bridge rectifier 130. Further, first spare pair 106, comprising conductors 4,5, may be connected to the first input terminal of second bridge rectifier 140 and second spare pair 108, comprising conductors 7,8, may be connected to the second input terminals of second bridge recitifier 140. The rectified positive rail 134 of first bridge rectifer 130 may be connected to rectified positive rail 144 of second bridge rectifier 140 and rectified negative rail 132 of first bridge rectifer 130 may be connected to rectified negative rail 142 of second bridge rectifier 140. Likewise, PD load 122 may be connected across the rectified positive and negative rails 234 and 232, respectively, of first bridge rectifier 130. Finally, second bridge rectifier 140 may contain a first leakage resistor $R_1$ having a first terminal connected to the rectified positive rail 144 of the second bridge rectifier 140 and a second terminal connected to the first input terminal of the second bridge rectifier 140. Likewise, a second leakage resistor $R_2$ may have a first terminal connected to the rectified negative rail 142 of second bridge rectifier 140 and a second terminal connected to the second input terminal of second bridge rectifier 140. The first leakage resistor $R_1$ and the second leakage resistor $R_2$ may each have a very large resistance value of, for example, 400 $1\Omega$ to ensure the leakage resistors do not interfere with normal operation of the PD when fully powered up. Thus, $R_1$ and $R_2$ in effect allow the voltages at the rectified positive and negative rails of first bridge rectifier 130 to be passively sensed by second voltage sensing circuit $V_{M2}$ even when the second bridge rectifier 140 is reverse-biased, as when power is being applied by PSE 110 to first and second data pairs 102 and 104, respectively, and when first and second spare pairs 106 and 108, respectively, remain unpowered.

The operation of system 100 will now be further described by reference to FIG. 3. FIG. 3 shows a flowchart presenting steps taken in a method for implementing one or more protocols for remote sensing of a PD-side voltage in PoE applications for estimating cable resistance, according to one or more embodiments of the present invention. With respect to FIG. 3, it is noted that certain details and features have been left out of flowchart 300 that are apparent to a person of ordinary skill in the art. For example, a step may comprise one or more sub-steps, as known in the art. While steps 310 through 360 indicated in flowchart 300 are sufficient to describe at least one embodiment of the present method, other embodiments may utilize steps different from those shown in flowchart 300, or may include more, or fewer steps.

Referring now to step 310 of the method embodied in FIG. 3, step 310 of flowchart 300 comprises applying power to a first end of a first and a second conductor pair of a cable. With respect to a first embodiment of the present invention, as disclosed in FIG. 1, step 310 may disclose power source 112 providing power to PD 120, by way of first data pair 102 and second data pair 104, when switch 114 is turned ON. It should be understood that step 310 may include conditions where PSE 110 is performing a classification of PD 120 after satisfactory PD detection, but may also include a condition where PSE 110 has already detected and classified PD 120 and is now fully powering PD 120 via first and second data pairs 102 and 104, respectively.

When switch 114 is turned on, a power circuit is closed such that a voltage from power supply 112 drives a substantial and measurable current $I_1$ through current sensing circuit $A_{M1}$, across first data pair 102, and into PD 120. This voltage forward biases first bridge rectifier 130 such that current flows out of rectified positive rail 134, through PD load 122, and back into rectified negative rail 132. The circuit then returns the current to PSE 110 via second data pair 104, where it travels through closed switch 114 and back to the negative terminal of power supply 112. Because a current flows through first and second data pairs 102 and 104, respectively, a voltage drop will appear across cable resistance $R_C$. Thus, a voltage provided across the PSE side of first and second data pairs 102 and 104, respectively, will be slightly higher than a voltage appearing across the PD-side of first and second data pairs 102 and 104, respectively. This voltage drop across $R_C$ is directly proportional to the power loss within the cable. Thus, by determining the voltage across the PSE side of the powered first and second data pairs 102 and 104, respectively, and the voltage across the PD-side of the powered first and second data pairs 102 and 104, respectively, the PSE may determine the voltage drop across the cable, estimate the resistance of the cable, and ultimately estimate the actual power dissipated by the cable. It should also be appreciated that, neglecting diode-related voltage drops, the voltage across the rectified positive and negative rails 134 and 132, respectively, of first bridge rectifier 130, is substantially the same as the voltage across the PD-side of first and second data pairs 102 and 104, respectively. Because the rectified positive rails of first and second bridge rectifiers 130 and 140, respectively, are connected, as are the rectified negative rails, the voltage across the PD-side of the first and second data pairs 102 and 104, respectively, also appears across the rectified positive and negative rails 144 and 142, respectively, of second bridge rectifier 140.

Continuing with step 320 in FIG. 3, step 320 of flowchart 300 comprises measuring a first voltage across the first end of the first and second conductor pairs of the cable. For example, voltage-sensing circuit $V_{M1}$ within PSE 110 may be used to determine the voltage $V_1$ across first and second data pairs 102 and 104, respectively, at the PSE side of the cable.

Moving to step 330 in FIG. 3, step 330 of flowchart 300 comprises measuring a first current flowing through the first and second conductor pairs of the cable while the first voltage is being applied across the first end of the first and second conductor pairs of the cable. For example, current-sensing circuit $A_{M1}$ within PSE 110 may be used to determine a first current $I_1$ flowing through first and second data pairs 102 and 104, respectively, while switch 114 is turned ON and power supply 112 is supplying power to the PD.

In the embodiment of the present invention disclosed in FIG. 1, since switch 116 is OFF, first and second spare pairs 106 and 108, respectively, are not fully powered by PSE 110. Thus, power source 112 does not directly impress a voltage across first and second spare pairs 106 and 108, respectively. Thus, in the absence of leakage resistors $R_1$ and $R_2$, a voltage present across rectified positive rail 144 and rectified negative rail 142 of second bridge rectifier 140 would not appear at second voltage measuring circuit $V_{M2}$ because the diodes of second bridge rectifier 140 would be reverse-biased, and thus turned OFF. However, because leakage resistors $R_1$ and $R_2$ are placed across the reverse biased diodes of second bridge rectifier 140, reverse-biased second bridge rectifier 140 may be effectively bypassed. The resistance of the resistors R1 and R2 is much lower than the reverse resistance of the diodes comprising the bridge rectifier 140 and yet high enough not to cause IEEE802.3at to be violated for back-feed voltage specifications. The voltage that appears across the voltage sensing circuit $V_{M2}$ is very close to the voltage on the combined rectified voltage rails of first and second bridge rectifiers 130 and 140. However, because of the non-infinite reverse resistance of the diodes of second bridge rectifier 140, the actual measured voltage at $V_{M2}$ is not exactly equal to, but proportionate to the rectified rail voltage. To eliminate this error, the procedure outlined by steps 310 through 340 may be performed for two significant currents passing through the first and second data pairs 102 and 104, respectively, as described above and below. Moving on to step 340 in FIG. 3, step 340 of flowchart 300 comprises measuring a second voltage across the first end of a third and a fourth conductor pair of the cable. For example, second voltage-sensing circuit $V_{M2}$ within PSE 110 may be used to determine the voltage $V_2$ across first and second spare pairs 106 and 108, respectively, at the PSE side of the cable. Thus, by utilizing leakage resistors $R_1$ and $R_2$ to bypass second bridge rectifier 140 within PD 120, PSE 110 may measure the voltage across the PSE side of first and second data pairs 102 and 104, respectively, using first voltage sensing circuit $V_{M1}$, and may passively measure the voltage across the PD-side of first and second data pairs 102 and 104, respectively, using second voltage sensing circuit $V_{M2}$. Hence, the actual voltage drop across the powered pairs of the cable may be determined as the difference between these two voltage measurements.

As stated above, a negligible or substantially zero leakage current may flow through leakage resistors $R_1$ and $R_2$ and a negligible or substantially zero diode leakage current may also flow through the reverse biased diodes of second bridge rectifier 140. In order to account for any error attributable to these negligible leakage currents, measurements of the voltages $V_1$ and $V_2$ by $V_{M1}$ and $V_{M2}$, respectively, may be made for each of two different currents $I_{1a}$ and $I_{1b}$ passing through first and second data pairs 102 and 104, respectively, allowing for the elimination of any such error. Thus, where a current $I_{1a}$ is passed through first and second data pairs 102 and 104, respectively, a voltage $V_{1a}$ may be measured by $V_{M1}$ and a voltage $V_{2a}$ may be measured by $V_{M2}$. $V_{1a}$ and $V_{2a}$ will thus correspond to the voltage across the PSE and PD sides, respectively, of first and second data pairs 102 and 104, respectively, while a current $I_{1a}$ is being passed. Likewise, where a current $I_{1b}$ is passed through first and second data pairs 102 and 104, respectively, a voltage $V_{1b}$ may be measured by $V_{M1}$ and a voltage $V_{2b}$ may be measured by $V_{M2}$. $V_{1b}$ and $V_{2b}$ will thus correspond to the voltage across the PSE and PD sides, respectively, of first and second data pairs 102 and 104, respectively, while a current $I_{1b}$ is being passed. Such a step may be shown by step 350 in FIG. 3 wherein steps 310 through 340 are repeated ensuring a first current is different the second time, $I_{1b}$, than the first time, $I_{1a}$.

Continuing with step 360 in FIG. 3, step 360 of flowchart 300 comprises determining the resistance of the cable using the measured first and second voltages and measured first current. Here, as stated above, because a voltage across each of the PSE side and the PD side of first and second data pairs 102 and 104, respectively, has been measured while passing each of two different currents, $I_{1a}$ and $I_{1b}$, the following calculations may be performed:

$$\Delta_1 = V_{1a} - V_{2a} \quad \Delta_2 = V_{1b} - V_{2b}$$

$$R_c = (\Delta_1 - \Delta_2)/(I_{1a} - I_{1b})$$

Where $R_C$ is the resistance of each conductive wire within the cable, I1a and I1b are the currents measured by current sensing circuit $A_{M1}$, $V_{1a}$ and $V_{1b}$ are the voltages measured by first voltage sensing circuit $V_{M1}$ while currents $I_{1a}$ and $I_{1b}$ are flowing, respectively, and $V_{2a}$ and $V_{2b}$ are the voltages measured by second voltage sensing circuit $V_{M2}$ while currents $I_{1a}$ and $I_{1b}$ are flowing, respectively.

Thus, the above embodiment of the present invention provides the important innovation wherein an actual resistance $R_C$ of an ethernet cable may be calculated by measuring a PSE-side voltage drop across a first and second spare pair of an ethernet cable, carrying negligibly small or no current, to estimate a PD side voltage drop across a first and second data pair, carrying a substantial and measurable current. Thus, by measuring the PSE side voltage drop across first and second data pairs, the PSE side voltage drop across first and second spare pairs, and the current passing through first and second data pairs under the above conditions, the actual resistance $R_C$ of an ethernet cable may be calculated. Moreover, this procedure may be performed during any state of operation where the current through first and second data pairs is substantial and the current through first and second spare pairs is negligible or substantially zero.

Thus, an embodiment of the present invention may overcome the drawbacks and deficiencies in the art while providing a physical design and associated protocol that is relatively inexpensive and simple to implement which provides an estimation of the actual cable resistance, and hence, the actual cable loss in a particular PoE application.

Figure 2:
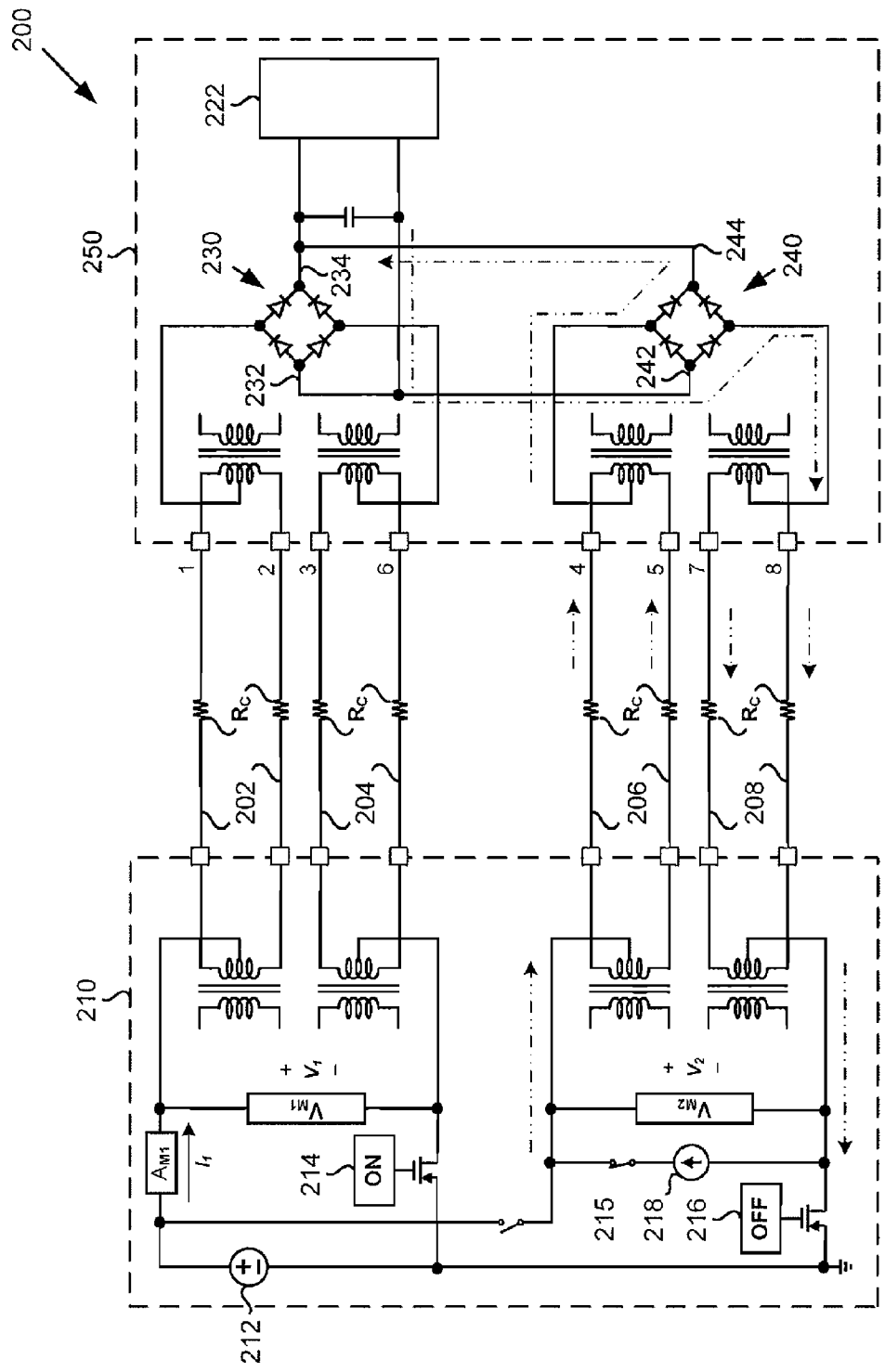
FIG. 2 presents a diagram of a system implementing a protocol for remote sensing of a PD-side voltage in PoE applications for estimating cable resistance, according to another embodiment of the present invention.

A second embodiment of the present invention will now be discussed with reference to FIGS. 2. FIG. 2 shows a system 200 implementing a protocol for remote sensing of a PD-side voltage in PoE applications for estimating cable resistance, according to a second embodiment of the present invention. As shown in FIG. 2, system 200 includes novel power sourcing equipment device (PSE) 210 and powered device (PD) 250 connected to one another by way of, for example, an Ethernet cable connection which includes first and second data pairs 202 and 204, respectively, and first and second spare pairs 206 and 208, respectively. Each conductive line of a pair within the Ethernet cable will have an intrinsic resistance $R_C$. In operation, PSE 210 may be configured to utilize first and second data pairs 202 and 204, respectively, and/or first and second spare pairs 206 and 208, respectively, to power PD 250 which may be, by way of example, an IP telephone, wireless LAN Access Point, Security network camera or other IP-based terminal.

According to FIG. 2, novel PSE 210 has substantially the same design as novel PSE 110 in FIG. 1 wherein like elements and components correspond to like numerals. Thus, according to FIG. 2, novel PSE 210 may include a power supply 212, a current sensing circuit $A_{M1}$, switch 214, switch 216, a first voltage sensing circuit $V_{M1}$, and a second voltage sensing circuit $V_{M2}$, arranged as described above regarding novel PSE 110. Novel PSE 210 may further comprise a small current source 218, in-line with a switch 215, connected across second voltage sensing circuit $V_{M2}$.

Similarly, although not the same design as novel PD 120, like elements and components of PD 250 may correspond to like numerals of novel PD 120. Thus, according to FIG. 2, PD 250 may include a first bridge rectifier 230 and second bridge rectifier 140 each having first and second input terminals, rectified positive rails 234 and 244, respectively, and rectified negative rails 232 and 242, respectively, and PD load 222. However, PD 250 does not incorporate first and second leakage resistors $R_1$ and $R_2$, respectively.

The operation of system 200 will now be further described by reference to FIG. 4. FIG. 4 shows a flowchart presenting steps taken in a method for implementing one or more protocols for remote sensing of a PD-side voltage in PoE applications for estimating cable resistance, according to one or more embodiments of the present invention. With respect to FIG. 4, it is noted that certain details and features have been left out of flowchart 400 that are apparent to a person of ordinary skill in the art. For example, a step may comprise one or more sub-steps, as known in the art. While steps 410 through 460 indicated in flowchart 400 are sufficient to describe at least one embodiment of the present method, other embodiments may utilize steps different from those shown in flowchart 400, or may include more, or fewer steps.

Regarding the operation of system 200, steps 410 through 430 are carried out as described above in steps 310 through 330 of FIG. 3, regarding system 100 of FIG. 1. Thus, as disclosed in FIG. 2, step 410 may disclose power source 212 providing power to PD 250, by way of first data pair 202 and second data pair 204, when switch 214 is turned ON. Step 410 may include conditions where PSE 210 is performing a classification of PD 250, after satisfactory PD detection, but may also include a condition where PSE 210 has already detected and classified PD 250 and is now fully powering PD 250 via first and second data pairs 202 and 204, respectively.

Continuing with step 420 in FIG. 4, step 420 of flowchart 400 comprises measuring a first voltage across the first end of the first and second conductor pairs of the cable. For example, voltage-sensing circuit $V_{M1}$ within PSE 210 may be used to determine the voltage $V_1$ across first and second data pairs 202 and 204, respectively, at the PSE side of the cable.

Step 430 of flowchart 300 comprises measuring a first current flowing through the first and second conductor pairs of the cable while the first voltage is being applied across the first end of the first and second conductor pairs of the cable. For example, current-sensing circuit $A_{M1}$ within PSE 210 may be used to determine a first current $I_1$ flowing through first and second data pairs 202 and 204, respectively, while switch 214 is turned ON and power supply 212 is supplying power to the PD, as previously stated.

As previously stated regarding FIG. 1, in the absence of leakage resistors $R_1$ and $R_2$, a voltage present across rectified positive rail 244 and rectified negative rail 242 of second bridge rectifier 240 does not appear at second voltage measuring circuit $V_{M2}$ because the diodes of second bridge rectifier 240 are reverse-biased, and thus turned OFF. Thus, for conventional PSEs the voltage present across rectified positive rail 244 and rectified negative rail 242 of second bridge rectifier 240 is not passively discoverable by measuring the voltage appearing across the PSE side of first and second spare pairs 206 and 208, respectively, of a connected Ethernet cable, for example. However, the second embodiment of the present invention, disclosed in FIG. 2 overcomes this limitation of conventional PSEs.

Step 440 of flowchart 400 comprises applying a current source across the first end of the third and fourth conductor pairs of the cable. For example, switch 215 may be closed and a small current may be applied by current source 218. This small current may preferably be very small such that a voltage drop appearing across first and second spare pairs 206 and 208, respectively, will be negligible, for example, less than 10 µA. Current source 218 would drive current, as indicated by the broken arrows in FIG. 2, through first spare pair 206 into a first input of second bridge rectifier 240. Because the small current is provided by a current source designed to source a precise current, the voltage at the first input of second bridge rectifier 240 may ramp up until second bridge rectifier 240 is forward biased and allows the small current to flow. As in FIG. 1, because the voltage across the rectified positive and negative rails 244 and 242, respectively, of second bridge rectifier is substantially equal to the voltage across the PD-side of first and second data pairs 202 and 204, respectively, the voltage across the first and second inputs of second bridge rectifier 240 will rise to a value substantially equal to the voltage across the PD-side of first and second data pairs 202 and 204, respectively, in order to forward bias second bridge rectifier 240 and allow current source 218 to source the small current, neglecting diode voltage drops.

The small current may continue along a path indicated by the broken arrows of FIG. 2, out rectified positive rail 244, through PD load 222, back into rectified negative rail 242, out the second input of second bridge rectifier 240, across second spare pair 208, and back to the negative terminal of current source 218. Because the current sourced by current source 218 is very small, for example less than 10 µA, the voltage drop across first and second spare pairs 206 and 208, respectively, will be very small and the voltage appearing across second voltage sensing circuit $V_{M2}$ will be substantially equal to the voltage across first and second data pairs 202 and 204, respectively.

Step 450 of flowchart 400 comprises measuring a second voltage across the first end of a third and a fourth conductor pair of the cable. For example, second voltage-sensing circuit $V_{M2}$ within PSE 210 may be used to determine the voltage $V_2$ across first and second spare pairs 206 and 208, respectively, at the PSE side of the cable. Thus, PSE 110 may measure the voltage $V_1$ across the PSE side of first and second data pairs 202 and 204, respectively, using first voltage sensing circuit $V_{M1}$, and, by utilizing a small sourced current supplied by current source 218, may measure the voltage across the PD-side of first and second data pairs 202 and 204, respectively, appearing across second voltage sensing circuit $V_{M2}$, appearing as $V_2$. Hence, the actual voltage drop across the powered pairs of the cable may be determined as the difference between $V_1$ and $V_2$. It should be noted that during this step of a method according to one embodiment of the present invention, first and second spare pairs 206 and 208, respectively, are not fully powered by power supply 212 of PSE 210.

It should be noted that in contrast to an embodiment of the present invention as disclosed above and in FIG. 1, because current source 218 forward biases the diodes of second bridge rectifier 240 and Leakage resistors R1 and R2 are not employed in conventional PD 250, the leakage currents disclosed above, occurring in the circuit shown in FIG. 1, are not present in the circuit shown in FIG. 2. Thus, only one current measurement, $I_1$, through $A_{M1}$ is necessary regarding the circuit shown in FIG. 2. Thus, $V_1$ is measured by $V_{M1}$ and $V_2$ is measured by $V_{M2}$ while a current $I_1$ is flowing through first and second data pairs 202 and 204, respectively.

Continuing with step 460 in FIG. 4, step 460 of flowchart 400 comprises determining the resistance of the cable using the measured first and second voltages $V_1$ and $V_2$ and measured first current $I_1$ as described above using the following calculation:

$$R_C = (V_1 - V_2)/I_1$$

Thus, a second embodiment of the present invention also provides the important innovation wherein an actual resistance $R_C$ of an ethernet cable may be calculated by measuring a PSE-side voltage drop across a first and second spare pair of an ethernet cable, carrying negligibly small or no current, to estimate a PD side voltage drop across a first and second data pair, carrying a substantial and measurable current. Thus, by measuring the PSE side voltage drop across first and second data pairs, the PSE side voltage drop across first and second spare pairs, and the current passing through first and second data pairs under the above conditions, the actual resistance $R_C$ of an ethernet cable may be calculated. Moreover, as with the first embodiment of the present invention, this procedure may be performed during any state of operation where the current through first and second data pairs is substantial and the current through first and second spare pairs is negligible.

Therefore, a second embodiment of the present invention may overcome the drawbacks and deficiencies in the art while providing a physical design and associated protocol that is relatively inexpensive and simple to implement which provides an estimation of the actual cable resistance, and hence, the actual cable loss in a particular PoE application, even when that cable is connected to a conventional PD.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. As such, the described embodiments are to be considered in all respects as illustrative and not restrictive. It should also be understood that the invention is not limited to the particular embodiments described herein, but is capable of many rearrangements, modifications, and substitutions without departing from the scope of the invention.

What is claimed is:

1. A method for detecting a resistance of a cable, the method comprising:
    applying power to a first end of a first and a second conductive pair of the cable;
    measuring a first voltage across the first end of the first and second conductive pairs of the cable;
    measuring a second voltage across the first end of a third and a fourth conductive pair of, the cable;
    determining a resistance of the cable using the measured first and second voltages, wherein a second end of the first, second, third and fourth conductive pairs of the cable are connected to a first, a second, a third and a fourth input terminal of a powered device, respectively; and
    bypassing a rectifier disposed within the device such that the second voltage across the first end of the third and fourth conductive pairs of the cable is substantially the same as a third voltage across the first and second input terminals of the powered device, wherein the rectifier is connected to the third and fourth input terminals of the powered device and a current flowing through third and fourth conductive pairs of the cable is substantially zero.

2. The method of claim 1, further comprising measuring a first current flowing through the first and second conductive pairs of the cable while the first voltage is being applied across the first and second conductive pairs of the cable.

3. The method of claim 2, wherein the resistance of the cable is determined using the measured first and second voltages and the measured first current.

4. The method of claim 2, wherein the method is performed a first time and a second time, such that the first current measured the first time is different from the first current measured the second time; and
    wherein the resistance of the cable is determined, accounting for a leakage error, using the measured first and second voltages and the measured first current from each of the first time and the second time.

5. A method for detecting a resistance of a cable, the method comprising:
    applying power to a first end of a first and a second conductive pair of the cable;
    measuring a first voltage across the first end of the first and second conductive pairs of the cable;
    applying a current source across the first end of a third and a fourth conductive pair of the cable such that a second voltage across the current source is substantially equal to a third voltage across a second end of the first and second conductive pairs;
    measuring the second voltage across the current source; and
    determining a resistance of the cable using the measured first and second voltages, wherein a second end of the first, second, third and fourth conductive pairs of the cable are connected to a first, a second, a third and a fourth input terminal of a powered device, respectively;
    wherein the current source applies a current through the third and fourth conductive pairs of the cable to forward-bias a rectifier within the powered device such that the second voltage across the current source becomes substantially the same as the third voltage across the first and second input terminals of the device, and wherein the rectifier is connected to the third and fourth input terminals of the powered device and a current flowing through third and fourth conductive pairs of the cable is substantially zero.

6. The method of claim 5, further comprising measuring a first current flowing through the first and second conductive pairs of the cable while the first voltage is being applied across the first and second conductive pairs of the cable.

7. The method of claim 6, wherein the resistance of the cable is determined using the measured first and second voltages and the measured first current.

8. The method of claim 5, wherein the method is carried out during a classification of the device by a power supply equipment device (PSE).

* * * * *